United States Patent
Hata et al.

(10) Patent No.: US 6,603,146 B1
(45) Date of Patent: Aug. 5, 2003

(54) GALLIUM NITRIDE GROUP COMPOUND SEMICONDUCTOR LIGHT-EMITTING DEVICE

(75) Inventors: Toshio Hata, Nara (JP); Taiji Morimoto, Nara (JP); Takeshi Kamikawa, Nara (JP); Kensaku Yamamoto, Tenri (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/684,279

(22) Filed: Oct. 6, 2000

(30) Foreign Application Priority Data

Oct. 7, 1999 (JP) .............................. 11-286326

(51) Int. Cl.[7] .............................................. H01L 27/15
(52) U.S. Cl. .............................. 257/79; 257/13; 257/80; 257/82; 257/89; 257/93; 257/98; 257/99; 257/103; 257/918
(58) Field of Search .............................. 257/81, 84, 88, 257/92, 93, 98, 99, 100, 690, 698, 700

(56) References Cited

U.S. PATENT DOCUMENTS

| | | | | |
|---|---|---|---|---|
| 5,952,680 A | * | 9/1999 | Strite | 257/88 |
| 5,994,722 A | * | 11/1999 | Averbeck et al. | 257/89 |
| 6,030,700 A | * | 2/2000 | Forrest et al. | 428/336 |
| 6,066,861 A | * | 5/2000 | Höhn et al. | 257/99 |

FOREIGN PATENT DOCUMENTS

| | | | | |
|---|---|---|---|---|
| JP | 9-153645 | | 6/1997 | |
| WO | WO 97/48138 | * | 12/1997 | H01L/33/00 |

* cited by examiner

Primary Examiner—Long Pham
Assistant Examiner—Wai-Sing Louie
(74) Attorney, Agent, or Firm—Morrison & Foerster LLP

(57) ABSTRACT

A semiconductor light-emitting device includes: a substrate; a semiconductor layer including at least one light-emitting region; a metal layer having a light transmitting characteristic; a first fluorescent material layer for converting at least a portion of first light emitted from the light-emitting region into second light having a different wavelength from the first light; and an oxide semiconductor layer formed between the metal layer and the first fluorescent material layer, and having a light-transmitting characteristic.

23 Claims, 9 Drawing Sheets

GALLIUM NITRIDE GROUP COMPOUND SEMICONDUCTOR LIGHT-EMITTING DEVICE

BACKGROUND OF THE INVENTION

1. Field of the Invention

The present invention relates to a gallium nitride group compound semiconductor light-emitting device, which is capable of emitting light from the visible region to the ultraviolet region of the light spectrum, and more specifically, the present invention relates to a gallium nitride group compound semiconductor light-emitting device having a semiconductor layer which it formed on a substrate and includes a light-emitting region.

2. Description of the Related Arts

Figure 10:
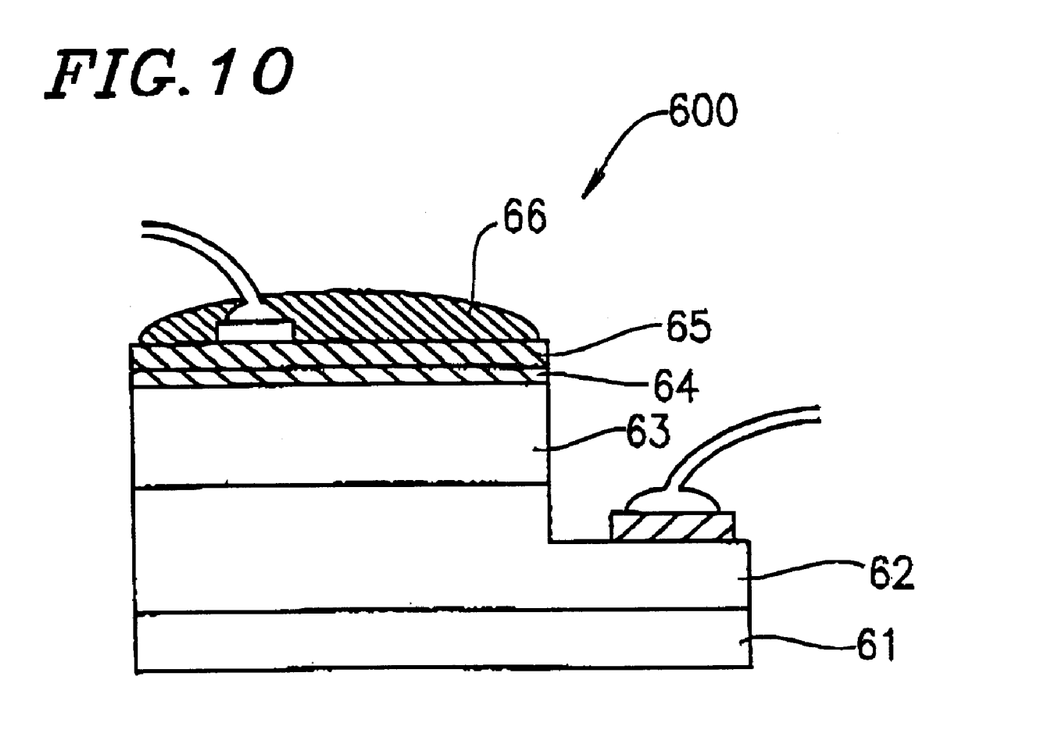
FIG. 10 illustrates a conventional gallium nitride group compound semiconductor light-emitting device.

FIG. 10 Illustrates a conventional gallium nitride group compound semiconductor light-emitting device 600.

The gallium nitride group compound semiconductor light-emitting device 600 includes: a insulative sapphire substrate 61; an N-type gallium nitride group compound semiconductor layer 62 and a P-type gallium nitride group compound semiconductor layer 63 formed on the substrate in this order and a light-transmittable thin film electrode 64 for the P-type gallium nitride group compound semiconductor layer 63, an insulation layer 65, and a fluorescent material layer 66 formed thereon in this order.

Light emitted from the semiconductor layers 62 and 63 is transmitted through the light-transmittable thin film electrode 64 and the insulation layer 65, and then enters the fluorescent material layer 66, where the light is converted into visible light having a different wavelength and then is emitted to the outside of the device.

However, the conventional gallium nitride group compound semiconductor light-emitting device 600 has the following problems.

The gallium nitride group compound semiconductor light-emitting device 600 is characterized by having the light-transmittable thin film electrode 64 formed on the surface of the P-type gallium nitride group compound semiconductor layer 63, and the insulation layer 65 and the fluorescent material layer 66 formed thereon in this order.

Therefore, in order to increase the light-emitting power of the respective N-type and P-type gallium nitride group compound semiconductor layers 62 and 63, which are positioned under the fluorescent material layer 66, the light-transmittable thin film electrode 64 is required to maintain a light-transmitting characteristic from the visible region to the ultraviolet region of the light spectrum. Therefore, the light-transmittable thin film electrode 64 has to be practically formed as a thin film having a film thickness of about 10 nm.

In addition, in the case where the wavelength of the light is transformed by the fluorescent material layer 66, the fluorescent material layer 66 has to be formed as a layer having a thickness of 2 $\mu$m or more. This causes a problem in that the light-transmittable thin film electrode 64 cracks due to the heat strain created during the formation of the fluorescent material layer 66.

If the light-transmittable thin film electrode 64 cracks, the current flowing in the light-transmittable thin film electrode 64 becomes irregular, thereby making the emission of the gallium nitride group compound semiconductor light-emitting device 600 irregular.

Furthermore, the cracks increase the resistance of the light-transmittable thin film electrode 64. As a result, the driving voltage of the device increases and the reliability of the device is reduced.

SUMMARY OF THE INVENTION

According to one aspect of the invention, there is provided a semiconductor light-emitting device including: a substrate; a semiconductor layer including at least a light-emitting region; a metal layer having a light transmitting characteristic; a first fluorescent material layer for transforming at least a portion of first light emitted from the light-emitting region into second light having a different wavelength from the first light; and an oxide semiconductor layer formed between the metal layer and the first fluorescent material layer and having alight transmitting characteristic.

In one embodiment of the invention, the semiconductor layer is formed of a gallium nitride group compound semiconductor.

In another embodiment of the invention, the metal layer to formed of an ohmic metal thin film.

According to the structure described above, the oxide semiconductor layer which has a light transmitting characteristic is provided between the metal thin film (which has a light transmitting characteristic and is formed on the semiconductor layer) and the first fluorescent material layer. Therefore, even if a crack is created on the metal thin film, the current flows evenly in the metal thin film via the oxide semiconductor layer, thereby enabling a uniform emission from the light-emitting region and improving the reliability of the device.

Furthermore, the oxide semiconductor layer has a good adhesion, a good mechanical strength, a low moisture transmission, and a good thermal stability. Therefore, when the fluorescent material layer is formed, the oxide semiconductor layer is capable of acting as a protection layer for the metal thin film.

In addition, by forming the oxide semiconductor layer which acts as a layer for protecting the metal thin film and improving the conductivity, and providing the fluorescent material layer thereon, a gallium nitride group compound semiconductor light-emitting device is provided which is suitable for mass-production and effectively emits light to the outside of the device.

In still another embodiment of the invention, a thickness of the metal layer is from about 1 nm to about 10 nm.

According to the structure described above, the metal thin film formed on the semiconductor layer is designed to have a suitable thickness, thereby making it possible to provide a metal thin film having good transmittance without reducing an ohmic characteristic between the semiconductor layer and the metal thin film. As a result, a uniform light-emitting pattern is obtained in the light-emitting region of the semiconductor layer.

In still another embodiment of the invention, a thickness of the oxide semiconductor layer is from about 0.1 $\mu$m to about 1 $\mu$m.

In still another embodiment of the invention, the oxide semiconductor layer includes at least one of the materials selected from the group consisting of $In_2O_3$, $SnO_2$, ZnO, $Cd_2SnO_4$, and $CdSnO_3$.

According to the structure described above, the oxide semiconductor layer having a light transmitting characteristic formed on the metal thin film is designed to have a suitable thickness, thereby mating it possible to provide an oxide semiconductor layer which is excellent in conductivity and durability, and transmits a large portion of light emitted from the light-emitting region. As a result, a highly efficient and highly reliable device is provided, in which a uniform light-emitting pattern is obtained in the light-emitting region of the semiconductor layer.

In still another embodiment of the invention, a first electrode is formed on a portion of the metal layer.

According to the structure described above, the first electrode is formed directly on the metal thin film. Therefore, it is possible to inject the current effectively and directly into the device.

In still another embodiment of the invention, a second electrode is formed on a portion of the oxide semiconductor layer.

According to the structure described above, the oxide semiconductor layer is formed on the entire surface of the metal thin film, thereby a better ohmic characteristic between the semiconductor layer and the metal thin film is achieved. As a result, it is possible to inject the current evenly from the second electrode.

In still another embodiment of the invention, a conductive wire is formed on a portion of the oxide semiconductor layer.

According to the structure described above, external connection means, such as an Au wire is directly provided on the oxide semiconductor layer, so as to eliminate the second electrode. Therefore, the manufacturing process of the device is simplified, thereby reducing the manufacturing time and the device cost.

In still another embodiment of the invention, a bottom surface area of the metal layer is smaller than a bottom surface area of the oxide semiconductor layer; and a second fluorescent material layer is formed on each side face of the oxide semiconductor layer and the semiconductor layer.

In still another embodiment of the invention, a third fluorescent material layer is formed on a side face of the substrate.

According to the structure described above, effects of the fluorescent material layers formed on the side faces of the semiconductor layers or the substrate do not influence the metal thin film. Therefore, a better ohmic characteristic between the metal thin film and the semiconductor layer is achieved. In addition, the fluorescent material layers effectively convert the wavelength of the light emitted in a side direction from the light-emitting region into a desired wavelength. Therefore, a device suitable for mass-production is provided.

In still another embodiment of the invention, the first fluorescent material layer is obtained by laminating a plurality of fluorescent material layers, each of the plurality of fluorescent material layers having different light-emitting wavelengths from one another.

In another aspect of the invention, a semiconductor light-emitting device includes: a substrate; at least one first conductive semiconductor layer; a plurality of second conductive semiconductor layers provided on the at least one first conductive semiconductor layer with a predetermined width between each other; a plurality of metal layers having a light-transmitting characteristic; and a plurality of metal oxide layers having a light-transmitting characteristic, wherein: the at least one first conductive semiconductor layer and the plurality of second conductive semiconductor layers provide a plurality of light-emitting regions; the semiconductor light-emitting device further includes: the plurality of fluorescent material layers for converting at least a portion of first light emitted from at least one of the light-emitting region into second light having a different wavelength from the first light; and a plurality of oxide semiconductor layers formed between the plurality of metal layers and the plurality of fluorescent material layers, and having a light-transmitting characteristic; and each of the plurality of fluorescent material layers has a light-emitting wavelength different from each other.

In one embodiment of the invention, the at least one first conductive semiconductor layer and the plurality of second conductive semiconductor layers are each formed of a gallium nitride group compound semiconductor.

According to the structure described above, it is possible to simultaneously produce devices which emit light of different wavelengths to one another; without reducing the ohmic characteristics between the semiconductor layer and the metal thin film. Therefore, comparing to the prior art, the present invention makes it easier to provide a light-emitting device capable of emitting light having a plurality of wavelengths (for example, the three primary colors of light, i.e., red, green and blue), with substantially the same size as the conventional device. In addition, it is possible to produce devices which emit light of different wavelengths to each other at the same time. Therefore, normalization of the device characteristics in facilitated.

These and other advantages of the present invention will become apparent to those skilled in the art upon reading and understanding the following detailed description with reference to the accompanying figures.

DESCRIPTION OF THE PREFERRED EMBODIMENTS

Examples of the present invention will now be described in detail. In the following example, the gallium nitride group compound semiconductor light-emitting device includes, e.g., $In_xAl_yGa_{1-x-y}N$, where $x \geq 0$, $y \geq 0$, and $x+y \leq 1$.

(First Example)

A gallium nitride group compound semiconductor light-emitting device 100 according to a first example of the present invention will now be described with reference to FIG. 1.

Figure 1:
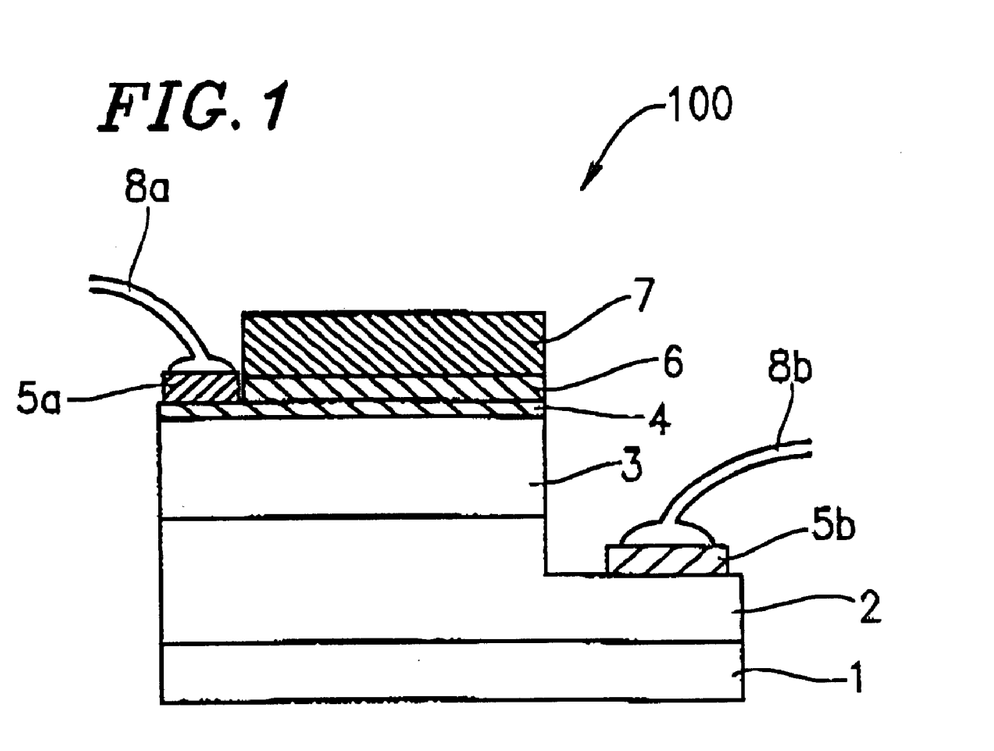
FIG. 1 illustrates a cross-sectional view of a gallium nitride group compound semiconductor light-emitting device according to a first example of the present invention.

FIG. 1 illustrate& a cross-sectional view of a gallium nitride group compound semiconductor light-emitting device 100 according to the first example of the present invention.

As illustrated in FIG. 1, an N-type gallium nitride group compound semiconductor layer 2 and a P-type gallium nitride group compound semiconductor layer 3 are laminated on, for example, a sapphire substrate 1, whereby a laminated structure of semiconductor layers including a light-emitting region is formed. Although in the present example, the sapphire substrate 1 is used, other substrates, such as one formed of GaN, SiC, Si or the like may be used as long as it is a substrate on which a gallium nitride group compound semiconductor layer can be laminated.

On the P-type gallium nitride group compound semiconductor layer 3, a light-transmittable ohmic metal thin film 4 is provided. On the ohmic metal thin film 4 and the exposed surfaces of the N-type gallium nitride group compound semiconductor layer 2, pad electrodes 5a and 5b are respectively formed to provide external electrical connection. The metal thin film 4 is formed by a vacuum evaporation method, an electron beam evaporation method or the like, so as to evaporate at least one of Au, Ni, Pt, Pd, etc. In order to obtain a small film resistance and a high transmittance, the metal thin film 4 is formed with a thickness from about 1 nm to about 10 nm. Pad electrodes 5a and 5b are formed of Au, Au alloy, Al, or the like. Each of the pad electrodes 5a and 5b are formed with a thickness from about 0.5 $\mu$m to about 0.8 $\mu$m, so that electrode peeling is less likely to occur. In the case where a conductive substrate, such as a GaN or SiC substrate, is used, the pad electrode 5b may be formed on the backside of the substrate, i.e., a side of the substrate opposite to the side on which the N-type gallium nitride group compound semiconductor layer 2 is formed.

A light-transmittable oxide semiconductor layer 6 is provided, so as to be formed on the metal thin film 4. The light-transmittable oxide semiconductor layer 6 may cover the metal thin film 4 and the pad electrode 5a. The oxide semiconductor layer 6 is formed by an evaporation method, sputtering, a CVD method, etc. In order to obtain a small film resistance and a high transmittance, the oxide semiconductor layer 6 is formed with a thickness from about 0.1 $\mu$m to about 1 $\mu$m. The oxide semiconductor layer 6 includes at least one of the substances selected from the group consisting of $In_2O_3$, $SnO_2$, ZnO, $Cd_2SnO_4$, and $CdSnO_3$. In the case where the oxide semiconductor layer 6 is formed of $In_2O_3$, a dopant selected from the group consisting of Sn, W, Mo, Zr, Ti, Sb, F, and the like is used. In the case where the oxide semiconductor layer 6 is formed of $SnO_2$, a dopant selected from the group consisting of Sb, P. Te, W, Cl, F, and the like is used. In the case where the oxide semiconductor layer 6 is formed of $Cd_2SnO_4$, Ta is used as a dopant. In the case where the oxide semiconductor layer 6 is formed of ZnO, a dopant selected from the group consisting of Al, In, B, F, and the like is used.

A fluorescent material layer 7 is provided so as to be formed on or to cover the oxide semiconductor layer 6. As a fluorescent material emitting red light, the fluorescent material layer 7 includes ZnS:Cu; $LiAlO_2$:$Fe^{3+}$; $Al_2O_3$:Cr; $Y_2O_3$:$Eu^{3+}$; $Y(P,V)O_4$:$Eu^{3+}$; $Y_2O_3$:Eu; a mixture of $Y_2O_3$:Eu and $Y_2O_3S$:Eu, or the like. As a fluorescent material emitting orange light, the fluorescent material layer 7 includes ZnS:Cu,Mn; (Zn,Cd)S:Ag; ZnS:Mn; $(Sr,Mg,Ba)_3(PO_4)_2$, or the like. As the fluorescent material emitting green light, a fluorescent material layer 7 includes ZnS:Cu, Al; $LaPO_4$:$Ce^{3+}$,$Tb^{3+}$; Sr(S,Se):Sm,Ce; $ZnSiO_4$: $Mn^{2+}$; $\beta$ZnS:Cu; ZnS:Cu,Fe(Co); ZnS:PbZnS:Cu; a mixture of ZnS:Cu, Al and $Y_2Al_5O_{12}$:Tb, or the like. As a fluorescent material emitting blue light, the fluorescent material layer 7 includes CaS:Bi; $(Sr,Ca)_{10}(PO_4)_6Cl_2$:$Eu^{2+}$; SrS:Sm,Ce; $Sr_2P_2O_7$:$Eu^{2+}$; $\beta$ZnS:Ag; $(Ba,Ca,Mg)_{10}(PO_4)_6Cl_2$:$Eu^{2+}$; $3Sr_3(PO_4)_2.CaCl_2$:$Eu^{2+}$, or the like. As the fluorescent material emitting white light, a fluorescent material layer 7 includes ZnO:Zn; ZnS:AsZnS:Au,Ag,Al; $Ca_2P_2O_7$:Dy; $Ca_3(PO_4)_2.CaF_2$:Sb; $3Ca_3(PO_4)_2.Ca(F,Cl)_2$:$Sb^{3+}$; $3Ca_3(PO_4)_2.Ca(F,Cl)_2$:$Sb^{3+}$,$Mn^{2+}$; $MgWO_4$, or the like. The fluorescent material layer 7 may include one of the above listed fluorescent materials or a plurality of the above listed fluorescent materials mixed with or laminated to each other. The method for forming the fluorescent material layer 7 includes a variety of formation methods, such as evaporation methods, spin coating of the materials dispersed in an organic solvent or a resin, patterning by screen printing, casting, molding, or the like. In order to convert the wavelength of desired amount of light to a different wavelength, the fluorescent material layer 7 has to be formed far thicker than the metal thin film 4 and the oxide semiconductor layer 6. For example, the thickness of the fluorescent material layer 7 is from about 50 $\mu$m to about 200 $\mu$m. Specifically, the thickness of the fluorescent material layer 7 is designed to be a suitable value in each example, since tn some cases the color of the original light is mixed in order to obtain a desired emitting wavelength.

In order to provide the pad electrodes 5a and 5b with an external electrical contact, a portion of the oxide semiconductor layer 6 and the fluorescent material layer 7 may be removed, and metal wires 8a and 8b may be connected to the exposed pad electrodes 5a and 5b, respectively. The metal wires 8a and 8b are formed, for example, of Au, Al, or Cu.

According to the present example, by inserting the oxide semiconductor layer 6 between the metal thin film 4 and the fluorescent material layer 7, a better ohmic characteristic and a uniform current dispersion is achieved, whereby a current is uniformly injected in the light-emitting surface and a uniform light-emitting pattern is obtained. Therefore, the external light-emitting characteristic is improved. Accordingly, the present example of the invention provides a gallium nitride group compound semiconductor light-emitting device, which has an excellent electric characteristics between the P-type gallium nitride group compound semiconductor layer 3 and the metal thin film 4, and which is suitable for mass-production.

In the above example, the gallium nitride group compound semiconductor light-emitting device 100 having a homo junction structure is described. The present example, however, can be applicable to any gallium nitride group compound semiconductor light-emitting device, such as one having a double-hetero junction structure, a single-hetero junction structure, or one having a quantum well structure in an active layer.

A method for manufacturing the gallium nitride group compound semiconductor light-emitting device 100 of the first example of the present invention will be now described with reference to FIGS. 2A to 2C.

Figure 2A:
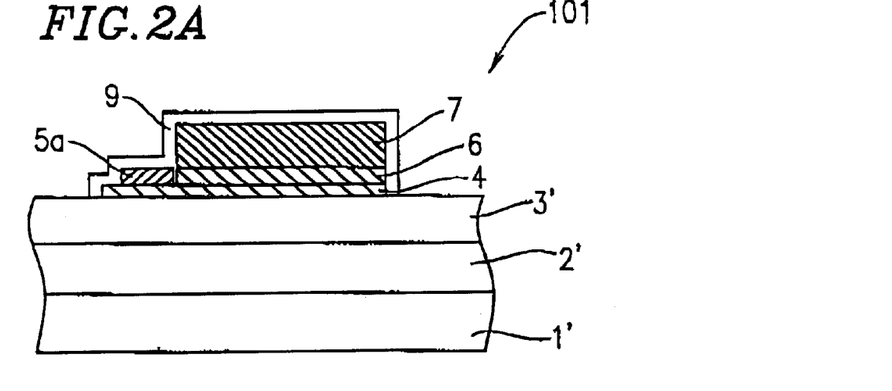
FIGS. 2A to 2C illustrate a method for manufacturing the gallium nitride group compound semiconductor light-emitting device according to the first example of the present invention.
Figure 2B:
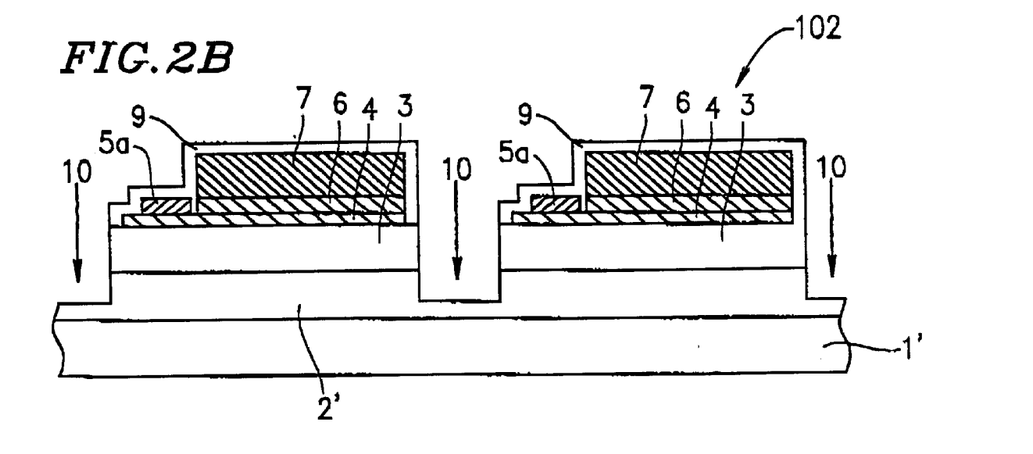
Figure 2C:
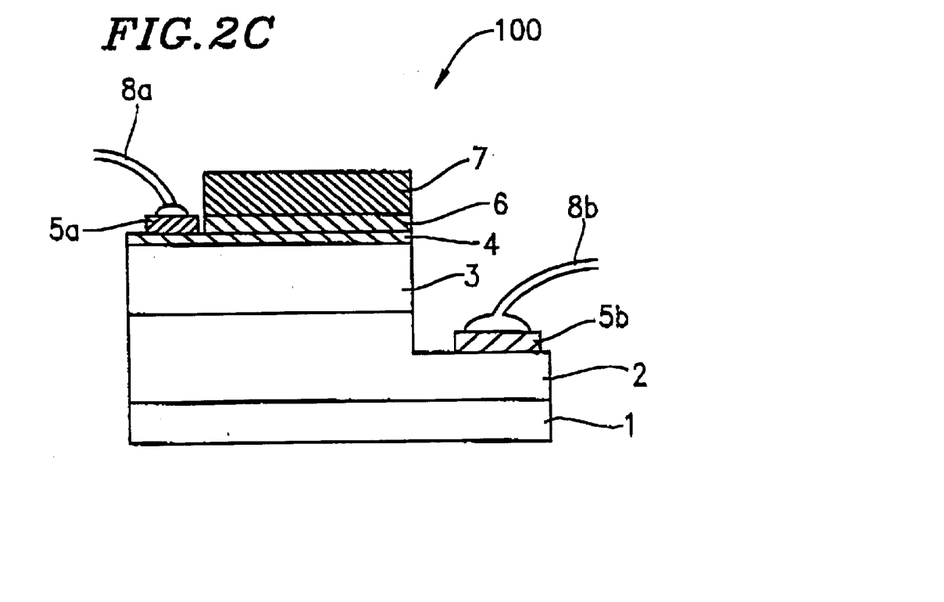

FIGS. 2A to 2C illustrate a method for manufacturing the gallium nitride group compound semiconductor light-emitting device 100 according to the first example of the present invention.

As illustrated by a laminated structure 101 in FIG. 2A, an N-type gallium nitride group compound semiconductor layer 2' and a P-type gallium nitride group compound semiconductor layer 3' are laminated in this order on a sapphire substrate 1', thereby forming a laminated structure of semiconductor layers including the light-emitting region of the light-emitting device 100. As a light-transmittable ohmic metal thin film 4, a layer of Ni with a thickness of about 7 nm is then formed on the P-type gallium nitride group compound semiconductor layer 3'. A layer of Au with a thickness of about 0.5 $\mu$m is formed thereon as a pad electrode 5a for providing an external electric contact. As a light-transmittable oxide semiconductor layer 6, a layer of $In_2O_3$ including Sn as a dopant and having a thickness of about 0.5 $\mu$m is then formed on the metal thin film 4. Powders of $Y_2O_3$:Eu fluorescent material are mixed in polyvinyl alcohol together with a small amount of dichromate and dispersed in the mixed solution. On the oxide semiconductor layer 6, the dispersed fluorescent material is deposited by spin coating. A mask pattern is applied to the deposited fluorescent material, and by exposing to ultraviolet rays, only the desired portions to become a fluorescent material layer 7 to hardened. Unnecessary portions of the fluorescent material are removed using an organic solvent. The fluorescent material used in this example may be a mixture of $Y_2O_3$:Eu and $Y_2O_3$S: Eu. In the next step, the light-emitting region is formed. A resist 9 is applied to a predetermined surface of the laminated structure 101. Using a conventional photoetching process, unnecessary portion of the oxide semiconductor layer 6 are removed by a ferric chloride group solution. Unnecessary portions of the metal thin film 4 are then removed using an etching process.

As indicated by reference numeral 10 in FIG. 2B, a laminated structure 102 is dry etched using the resist 9 as a dry etching mask, until portions of the surface of the N-type gallium nitride group compound semiconductor layer 2' are exposed.

An N-type pad electrode 5b is then formed on the exposed surface of the N-type gallium nitride group compound semiconductor layer 2' (see FIG. 2C) by laminating layers of Al (film thickness about 1500 Å) and Ti (film thickness: about 200 Å). After forming the N-type pad electrode 5b, the sapphire substrate 1' shown, in FIG. 2B is out by dicing, scribing, or the like, whereby the laminated structure 102 of the light-emitting device is divided into a chip of an about 500 $\mu$m square. Finally, Au wires 8a and 8b are formed on the electrode pads 5a and 5b, respectively, so as to provide the electrode pads 5a and 5b with external electrical connection. Accordingly, the gallium nitride group compound semiconductor device 100 shown in FIG. 2C is completed.

As described above, by inserting the oxide semiconductor layer 6 between the metal thin film 4 and the fluorescent material layer 7, a better ohmic characteristic between the metal thin film 4 and the P-type gallium nitride group compound semiconductor layer 3 is achieved, whereby a uniform light-emitting pattern is obtained.

Therefore, the present example of the invention overcomes the conventional problems between the metal thin film 4 and the fluorescent material layer 7, and provides a gallium nitride group compound semiconductor device 100 (e.g., having red light emittance with a light-emitting peak wavelength of 611 nm) which has a uniform light emittance and a good light-emitting efficiency, and it suitable for mass-production.

(Second Example)

A gallium nitride group compound semiconductor light-emitting device 200 according to a second example of the present invention will now be described with reference to FIG. 3.

Figure 3:
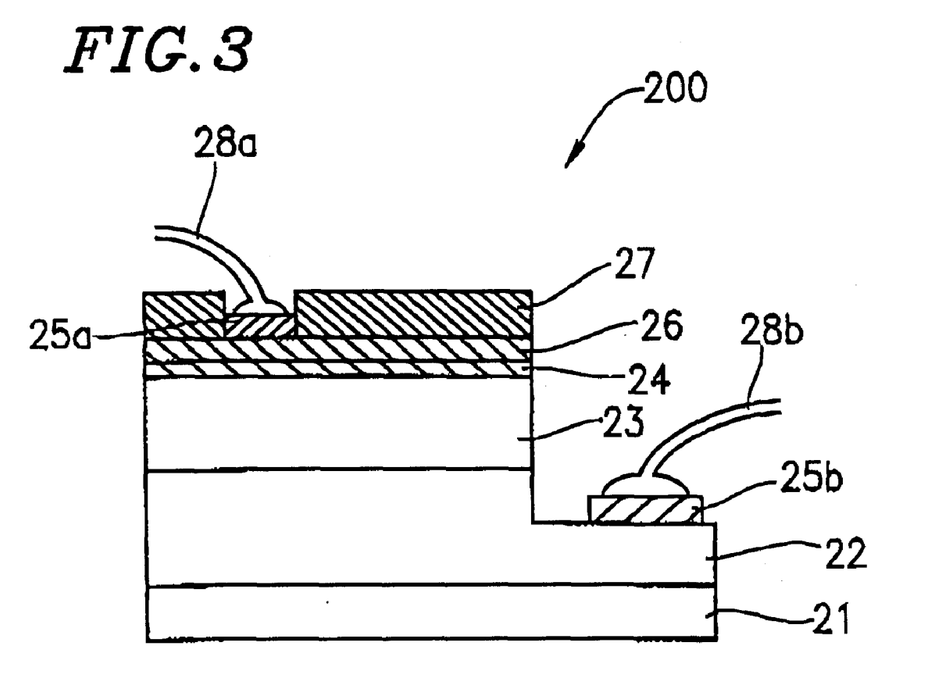
FIG. 3 illustrates a cross-sectional view of a gallium nitride group compound semiconductor light-emitting device according to a second example of the present invention.

FIG. 3 illustrates a cross-sectional view of a gallium nitride group compound semiconductor light-emitting device 200 according to the second example of the present invention. The materials used in this example are the same as those used in the first example, and therefore a detailed explanation thereof is omitted.

As illustrated in FIG. 3, an N-type gallium nitride group compound semiconductor layer 22 and a P-type gallium nitride group compound semiconductor layer 23 are laminated on, for example, a sapphire substrate 21, whereby a laminated structure of semiconductor layers including a light-emitting region is formed.

On the P-type gallium nitride group compound semiconductor layer 23, an ohmic metal thin film 24 and an oxide semiconductor layer 26 are provided. The ohmic metal thin film 24 and the oxide semiconductor layer 26 are both light transmittable.

On the oxide semiconductor layer 26 and the exposed surfaces of the N-type gallium nitride group compound semiconductor layer 22, pad electrodes 25a and 25b are respectively formed to provide an external electrical connection. A light-transmittable fluorescent material layer 27 is provided so as to be formed on or to cover the oxide semiconductor layer 26.

In order to provide the pad electrodes 25a and 25b with an external electrical contact, a portion of the fluorescent material layer 27 is removed, so that metal wires 28a and 28b may be connected to the exposed pad electrodes 25a and 25b, respectively.

Figure 4A:
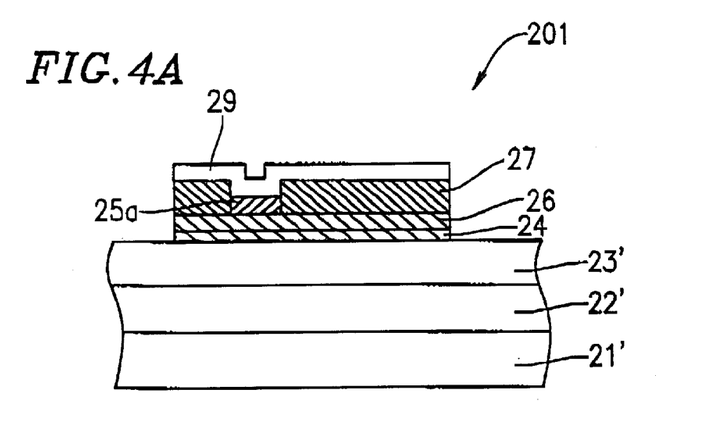
FIGS. 4A to 4C illustrate a method for manufacturing the gallium nitride group compound semiconductor light-emitting device according to the second example of the present invention.
Figure 4B:
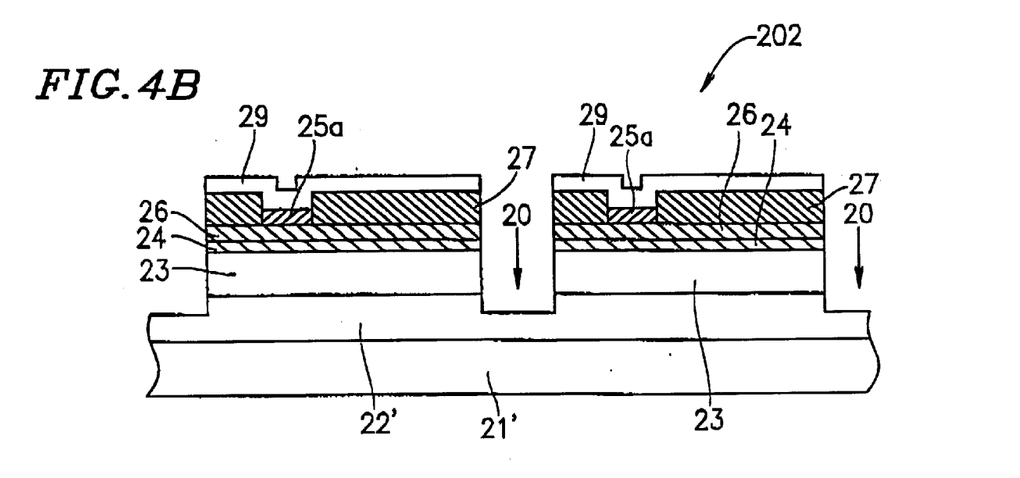
Figure 4C:
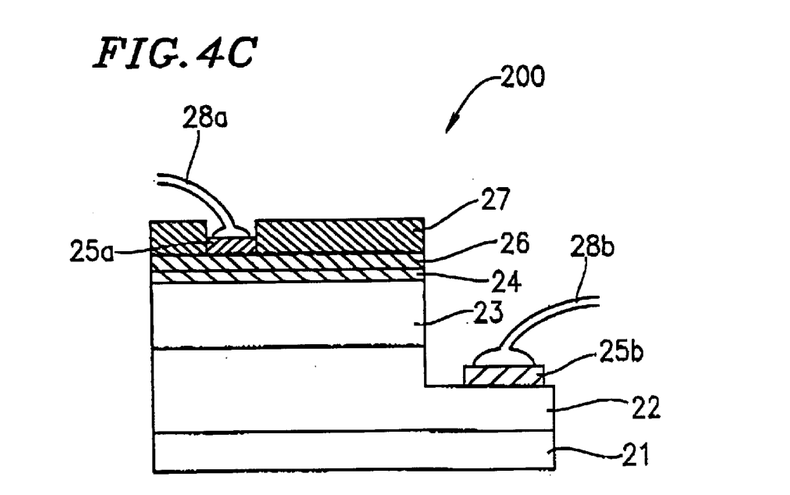

FIGS. 4A to 4C illustrate a method for manufacturing the gallium nitride group compound semiconductor light-emitting device 200 according to the second example of the present invention.

As illustrated by a laminated structure 201 in FIG. 4A, an N-type gallium nitride group compound semiconductor layer 22' and a P-type gallium nitride group compound semiconductor layer 23' are laminated in this order on a sapphire substrate 21', thereby forming a laminated structure of semiconductor layers including a light-emitting region. As a light-transmittable ohmic metal thin film 24, a layer of Pd with a thickness of from about 1 nm to about 3 nm to then formed on the P-type gallium nitride group compound semiconductor layer 23'. As a light-transmittable oxide semiconductor layer 26, a layer of $In_2O_3$ including Sn as a dopant and having a thickness of about 0.5 $\mu$m is then formed on the metal thin film 24. A layer of Au with a thickness of about 0.5 $\mu$m is formed thereon as a pad electrode 25a for providing an external electric connection. Powders of ZnS:Cu fluorescent material are mixed in polyvinyl alcohol together with a small amount of dichromate and dispersed in the mixed solution. On the oxide semiconductor layer 26, the dispersed fluorescent material is deposited by spin coating. A mast pattern is applied to the deposited fluorescent material, and by exposing the fluorescent material to ultraviolet rays, only the portions to become a fluorescent material layer 27 is hardened. Unnecessary portions of the fluorescent material are removed using an organic solvent. The fluorescent material used in this example may be a mixture of ZnS:Cu,Al and $Y_2Al_5O_{12}$:Tb. In the next step, the light-emitting region is formed. A resist 29 is applied to a predetermined surface of the laminated structure 201. Using a conventional photoetching process, unnecessary portions of the oxide semiconductor layer 26 are removed by a ferric chloride group solution. Unnecessary portions of the metal thin film 24 are then removed using an etching process.

As indicated by reference numeral 20 in FIG. 4B, a laminated structure 202 is dry etched using the resist 29 as a dry etching mask, until portions of the surface of the N-type gallium nitride group compound semiconductor layer 22' are exposed.

An N-type pad electrode 25b is then formed on the exposed surface of the N-type gallium nitride group compound semiconductor layer 22' (see FIG. 4C) by laminating layers of Al (film thickness: about 1500 Å) and Ti (film thickness: about 200 Å). After forming the N-type pad electrode 25b, the sapphire substrate 21' shown in FIG. 4B is out by dicing, scribing, or the 1ike, whereby the laminated structure 202 of the light-emitting device is divided into a chip of an about 500 µm square. Finally, Au wires 28a and 28b are formed on the electrode pads 25a and 25b, respectively, so as to provide the electrode pads 25a and 25b with the external electrical connection. Accordingly, the gallium nitride group compound semiconductor device 200 shown in FIG. 4C is completed.

According to the present example of the invention, Pd is used for the metal thin film 24. Although a thin film of Pd has an excellent light transmittance, it is likely to aggregate when thinly formed. Concentration of current in the aggregated portion may cause a deterioration of the device characteristics due to a thermal destruction as well as causing a deterioration of the fluorescent material layer 27 due to the heating. The present example of the invention overcomes such deterioration problems by inserting the oxide semiconductor layer 26 between the metal thin film 24 and the fluorescent material layer 27, thereby achieving a better ohmic characteristic between the metal thin film 24 and the P-type gallium nitride group compound semiconductor layer 23 even if the metal thin film 24 aggregates when formed, and thus achieving a uniform current diffusion.

Therefore, the present example of the invention overcomes the conventional problems associated with the electrical characteristic between the P-type gallium nitride group compound semiconductor layer 23 and the metal thin film 24, and thus provides a gallium nitride group compound semiconductor device 200 (e.g., having green light emittance with a light-emitting peak wavelength of 530 nm) which has a uniform emittance and a good light-emitting efficiency, and is suitable for mass-production.

Accordingly, by providing the oxide semiconductor layer 26 on the entire surface of the metal thin film 24, the present example of the invention also overcomes the conventional problems associated with the ohmic characteristic between the P-type gallium nitride group compound semiconductor layer 23 and the metal thin film 24, and thus provides a gallium nitride group compound semiconductor device 200 suitable for mass-production.

(Third Example)

A gallium nitride group compound semiconductor light-emitting device 300 according to a third example of the present invention will now be described with reference to FIG. 5.

Figure 5:
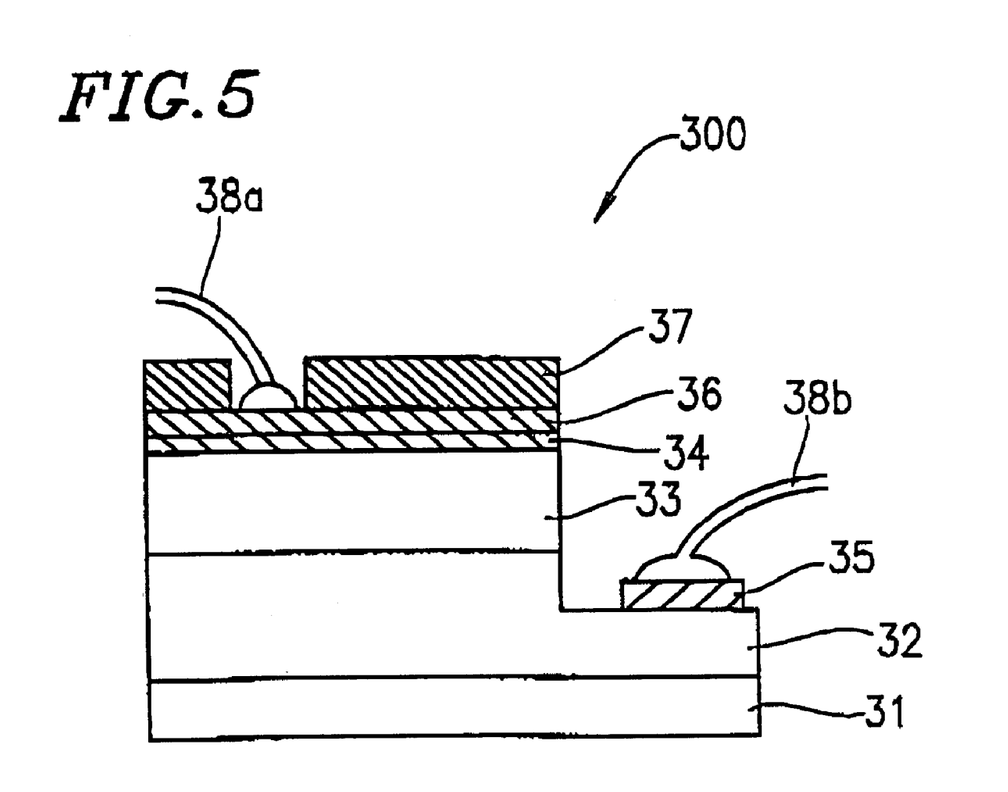
FIG. 5 illustrates a cross-sectional view of a gallium nitride group compound semiconductor light-emitting device according to a third example of the present invention.

FIG. 5 illustrates a cross-sectional view of a gallium nitride group compound semiconductor light-emitting device 300 according to the third example of the present invention. The materials used in this example are the same as those used in the first example, and therefore a detailed explanation thereof is omitted.

As illustrated in FIG. 5, an N-type gallium nitride group compound semiconductor layer 32 and a P-type gallium nitride group compound semiconductor layer 33 are laminated on, for example, a sapphire substrate 31, whereby a laminated structure of semiconductor layers including a light-emitting region is formed.

On the P-type gallium nitride group compound semiconductor layer 33, an ohmic metal thin film 34 and an oxide semiconductor layer 36 are provided. The ohmic metal thin film 34 and the oxide semiconductor layer 36 are both light-transmittable.

On the exposed surface of the N-type gallium nitride group compound semiconductor layer 32, a pad electrode 35 is respectively formed to provide external electrical connection.

A light-transmittable fluorescent material layer 37 is formed so as to be provided on or to cover the oxide semiconductor layer 36.

In order to provide the oxide semiconductor layer 36 with an external electrical contact, a portion of the fluorescent material layer 37 may be removed, so as to expose the oxide semiconductor layer 36 and directly connect a metal wire 38a thereto. In order to provide the pad electrode 35 with an external electrical contact, a metal wire 38b is connected to the pad electrode 35.

Figure 6A:
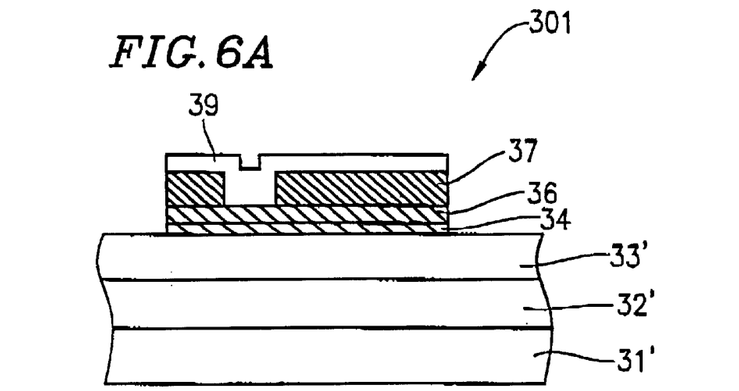
FIGS. 6A to 6C illustrate a method for manufacturing the gallium nitride group compound semiconductor light-emitting device according to the third example of the present invention.
Figure 6B:
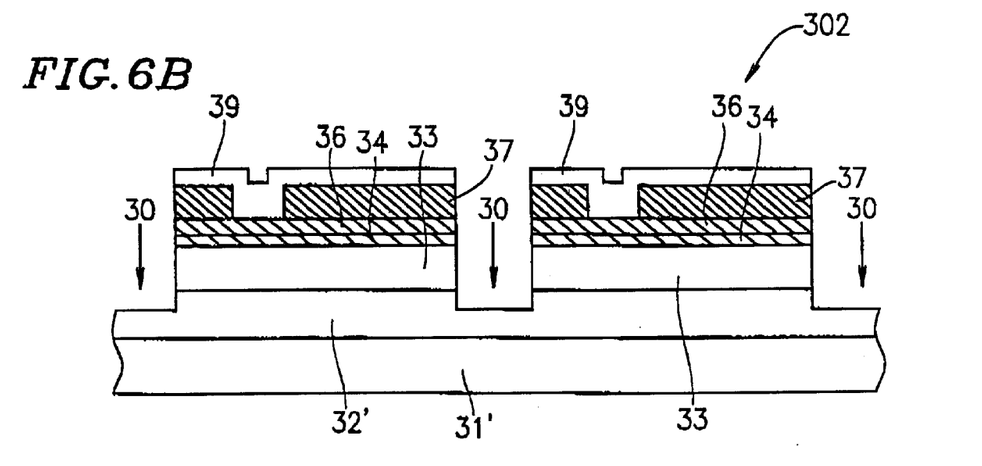
Figure 6C:
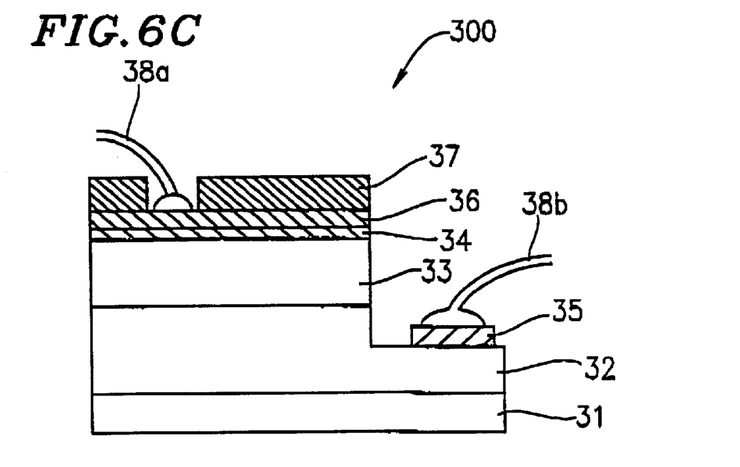

FIGS. 6A to 6C illustrate a method for manufacturing the gallium nitride group compound semiconductor light-emitting device 300 according to the third example of the present invention.

As illustrated by a laminated structure 301 in FIG. 6A, an N-type gallium nitride group compound semiconductor layer 32' and a P-type gallium nitride group compound semiconductor layer 33' are laminated in this order on a sapphire substrate 31', thereby forming a laminated structure of semiconductor layers including a light-emitting region. As a light-transmittable ohmic metal thin film 34, a layer of Ni with a thickness of about 10 nm is then formed on the P-type gallium nitride group compound semiconductor layer 33'. As a light-transmittable oxide semiconductor layer 36, a layer of $In_2O_3$ including Sn as a dopant and having a thickness of about 0.5 µm is then formed on the metal thin film 34. Powders of ZnS:Ag,Al fluorescent material are mixed in polyvinyl alcohol together with a small amount of dichromate and dispersed in the mixed solution. On the oxide semiconductor layer 36, the dispersed fluorescent material is deposited by spin coating. A mask pattern is applied to the deposited fluorescent material, and by exposing the fluorescent material to ultraviolet rays, only portions to become a fluorescent material layer 37 are hardened. Unnecessary portions of the fluorescent material are removed using an organic solvent. The fluorescent material used in this example may be $3Sr_3(PO_4)_2.CaCl_2:Eu^{2+}$. In the next step, the light-emitting region is formed. A resist 39 is applied to a predetermined surface of the laminated structure 301. Using a conventional photoetching process, unnecessary portions of the oxide semiconductor layer 36 are removed by a ferric chloride group solution. Unnecessary portions of the metal thin film 34 are then removed using an etching process.

As indicated by reference numeral 30 in FIG. 6B, a laminated structure 302 is dry etched using the resist 39 as a dry etching mask, until portions of the surface of the N-type gallium nitride group compound semiconductor layer 32' are exposed.

An N-type pad electrode 35 is then formed on the exposed surface of the N-type gallium nitride group compound semiconductor layer 32' (see FIG. 6C) by laminating layers of Al (film thickness: about 1500 Å) and Ti (film thickness: about 200 Å). After forming the N-type pad electrode 35, the sapphire substrate 31' shown in FIG. 6B is cut by dicing, scribing, or the like, whereby the laminated structure 302 of the light-emitting device in divided into a chip of an about 500 μm square. Finally, Au wires 38a and 38b are formed on the oxide semiconductor layer 36 and the N-type pad electrode 35, respectively, so as to provide the oxide semiconductor layer 36 and the N-type pad electrode 35 with an external electrical connection. Accordingly, the gallium nitride group compound semiconductor device 300 shown in FIG. 6C is completed.

According to the present example of the invention, the oxide semiconductor layer 36 is inserted between the metal thin film 34 and the fluorescent material layer 37, thereby achieving a better ohmic characteristic between the metal thin film 34 and the P-type gallium nitride group compound semiconductor layer 33, and achieving a uniform current dispersion.

Therefore, the present example of the invention overcomes the conventional problems associated with the electrical characteristic between the P-type gallium nitride group compound semiconductor layer 33 and the metal thin film 34, and thus provides the gallium nitride group compound semiconductor device 300 (e.g., having blue light emittance with a light-emitting peak wavelength of 450 nm) which has a uniform emittance and a good light-emitting efficiency, and is suitable for mass-production.

Accordingly, by providing the oxide semiconductor layer 36 on the entire upper surface of the metal thin film 34, the present example of the invention also overcomes the conventional problems associated with ohmic characteristic between the metal thin film 34 and the gallium nitride group compound semiconductor layer 33, and thus provides a gallium nitride group compound semiconductor device 300 suitable for mass-production. Furthermore, connecting the Au wire 38a directly to the oxide semiconductor layer 36 eliminates the need for forming a pad electrode thereon, thereby reducing the number of manufacturing steps.

(Fourth Example)

A gallium nitride group compound semiconductor light-emitting device 400 according to a fourth example of the present invention will now be described with reference to FIG. 7.

Figure 7:
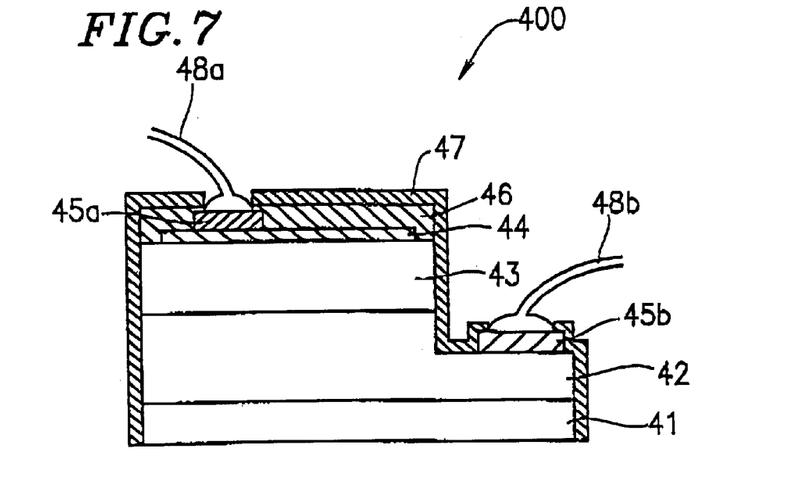
FIG. 7 illustrates a cross-sectional view of a gallium nitride group compound semiconductor light-emitting device according to a fourth example of the present invention.

FIG. 7 illustrates a cross-sectional view of a gallium nitride group compound semiconductor light-emitting device 400 according to the fourth example of the present invention. Other than a fluorescent material layer 47, the materials used in this example are the same as those used in the first example, and therefore detailed explanation thereof is omitted.

As illustrated in FIG. 7, an N-type gallium nitride group compound semiconductor layer 42 and a P-type gallium nitride group compound semiconductor layer 43 are laminated on, for example, a sapphire substrate 41, whereby a laminated structure of semiconductor layers including a light-emitting region is formed.

On the P-type gallium nitride group compound semiconductor layer 43, an ohmic metal thin film 44 and an oxide semiconductor layer 46 are provided. The ohmic metal thin film 44 and the oxide semiconductor layer 46 are both light-transmittable.

On an exposed surface of the ohmic metal thin film 44 and the N-type gallium nitride group compound semiconductor layer 42, pad electrodes 45a and 45b are respectively formed to provide an external electrical connection.

A light-transmittable fluorescent material layer 47 is formed so as to be provided on or to cover the oxide semiconductor layer 46.

In order to provide the pad electrodes 45a and 45b with an external electrical contact, a portion of the oxide semiconductor layer 46 and a portion of the fluorescent material layer 47 may be removed, so as to expose the pad electrodes 45a and 45b. Metal wires 48a and 48b are connected directly to the exposed pad electrodes 45a and 45b, respectively.

The fluorescent material layer 47 not only covers the oxide semiconductor layer 46 but also covers the side faces of the sapphire substrate 41, the N-type gallium nitride semiconductor layer 42, and the P-type gallium nitride semiconductor layer 43. The fluorescent material layer 47 can be formed on the side faces to cover only a desired portion of the side faces. For example, it may be formed only on the side faces of the N-type gallium nitride group compound semiconductor layer 42 and the P-type gallium nitride group compound semiconductor layer 43, and not on the side faces of the substrate 41. In the present example, $3Ca_3(PO_4)_2 \cdot Ca(F,Cl)_2:Sb^{3+},Mn^{2+}$ is used for the fluorescent material layer 47.

According to the above structure, the conventional problems associated with electrical characteristic between the P-type gallium nitride group compound semiconductor layer 43 and the metal thin film 44 are overcome, and thus it is possible to provide a gallium nitride group compound semiconductor device 400 (e.g., having white light emittance with two light-emitting peak wavelength, i.e., 480 nm and 570 nm) which has a uniform emittance and a good light-emitting efficiency, and is suitable for mass-production. The fluorescent material layer 47 may be formed so as to contact or cover the Au wires 48a and 48b on the pad electrodes 45a or 45b.

Moreover, since the fluorescent material layer 47 covers the side faces of the gallium nitride group compound semiconductor layers 42 and 43, the wave length of the light emitted in a side direction from the light-emitting region is also effectively converted.

In the case where the fluorescent material layer 47 is formed on the side faces of the sapphire substrate 41, the wavelength of light emitted from the light-emitting region in a direction toward the substrate can be effectively converted.

Furthermore, as shown in FIG. 7, the metal thin film 44 is formed so as to be smaller than the oxide semiconductor layer 46. Therefore, effects of the fluorescent material layers 47 formed on the side faces of the P-type gallium nitride group compound semiconductor layer 43 do not influence the metal thin film 44. Therefore, problems associated with the ohmic contact between the metal thin film 44 and the P-type gallium nitride group compound semiconductor layer 43 is overcome, whereby a gallium nitride group compound semiconductor light-emitting device 400 suitable for a mass-production is provided.

(Fifth Example)

Figure 8:
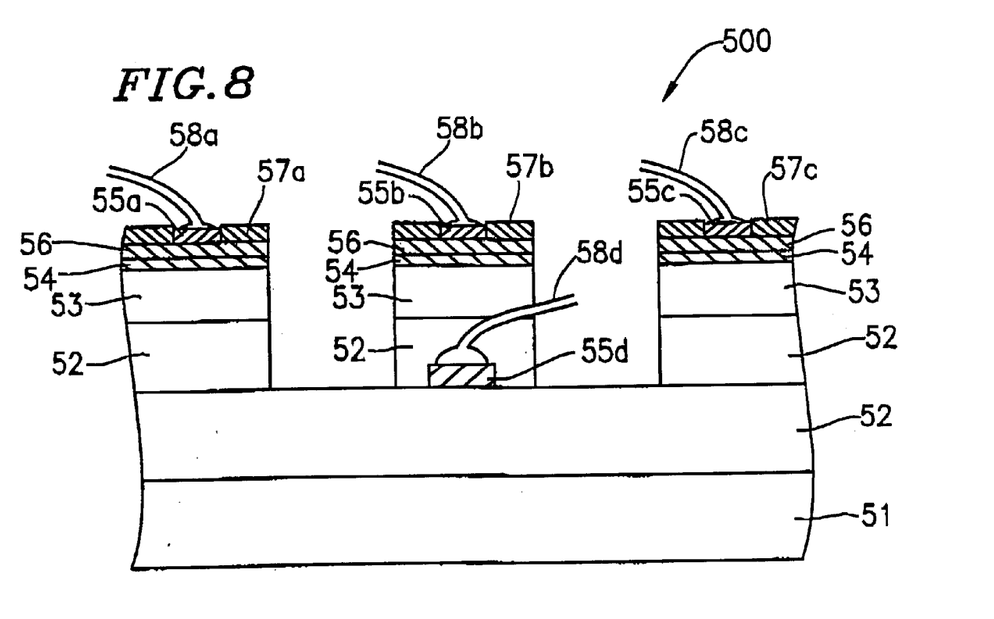
FIG. 8 illustrates a cross-sectional view of a gallium nitride group compound semiconductor light-emitting device according to a fifth example of the present inventions.

FIG. 8 illustrates a cross-sectional view of a gallium nitride group compound semiconductor light-emitting device 500 according to a fifth example of the present invention. The materials used in this example are the same as those used in the first example, and therefore detailed explanation thereof is omitted.

As illustrated in FIG. 8, an N-type gallium nitride group compound semiconductor layer 52 and a P-type gallium nitride group compound semiconductor layer 53 are laminated on, for example, a sapphire substrate 51, whereby a laminated structure of semiconductor layers including a light-emitting region is formed.

On the P-type gallium nitride group compound semiconductor layer 53, an ohmic metal thin film 54 and an oxide semiconductor layer 56 are provided. The ohmic metal thin film 54 and the oxide semiconductor layer 56 are both light-transmittable.

On the light-transmittable oxide semiconductor layer 56, pad electrodes 55a, 55b, and 56c are respectively formed to provide external electrical connection. On an exposed surface of the N-type gallium nitride group compound semiconductor layer 52, a pad electrode 55d is respectively formed to provide external electrical connection. In order to provide the pad electrode 55d, a metal wire 58d is connected to the pad electrode 55d. The pad electrode 55d and surrounding areas in FIG. 8 are shown as a side view.

A plurality of fluorescent material layers 57a, 57b, and 57c, each of which having a different light-emitting wavelength from each other, are provided, so as to be formed on or to cover the oxide semiconductor layer 56. The plurality of fluorescent material layers are, for example, a blue light-emitting fluorescent material layer 57a, a green light-emitting fluorescent material layer 57b, and a red light-emitting fluorescent material layer 57c.

In order to provide the pad electrodes 55a, 55b, and 55c with an external electrical contact, a portion of each of the fluorescent material layers 57a, 57b, and 57c are removed, so as to expose the pad electrodes 55a, 55b, and 55c. Metal wires 58a, 58b, and 58c are connected to the exposed surface of the pad electrodes 55a, 55b, and 55c.

Figure 9A:
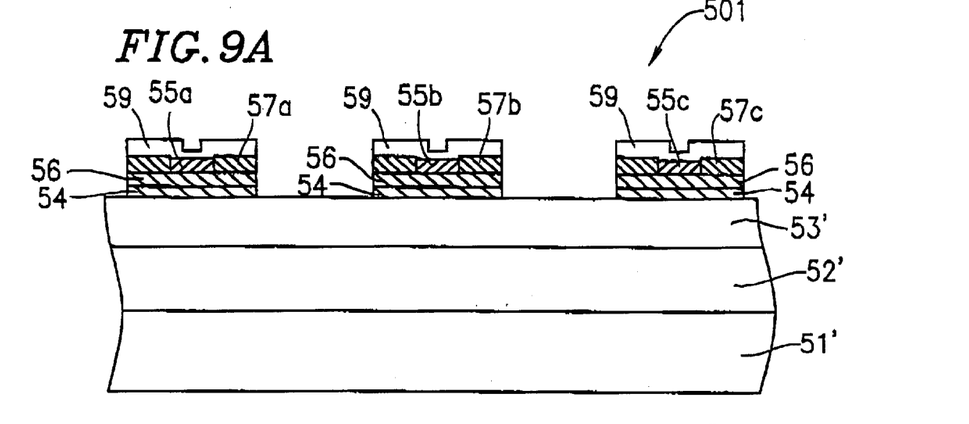
FIGS. 9A to 9C illustrate a method for manufacturing the gallium nitride group compound semiconductor light-emitting device according to the fifth example of the present invention.
Figure 9B:
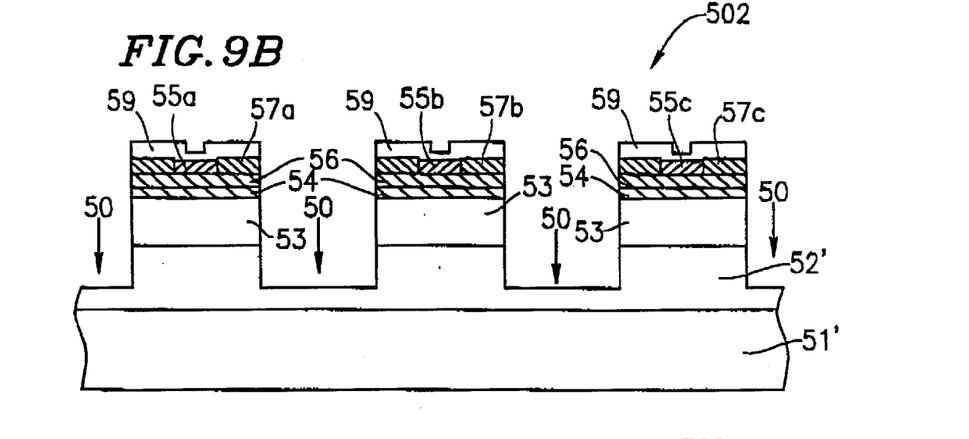
Figure 9C:
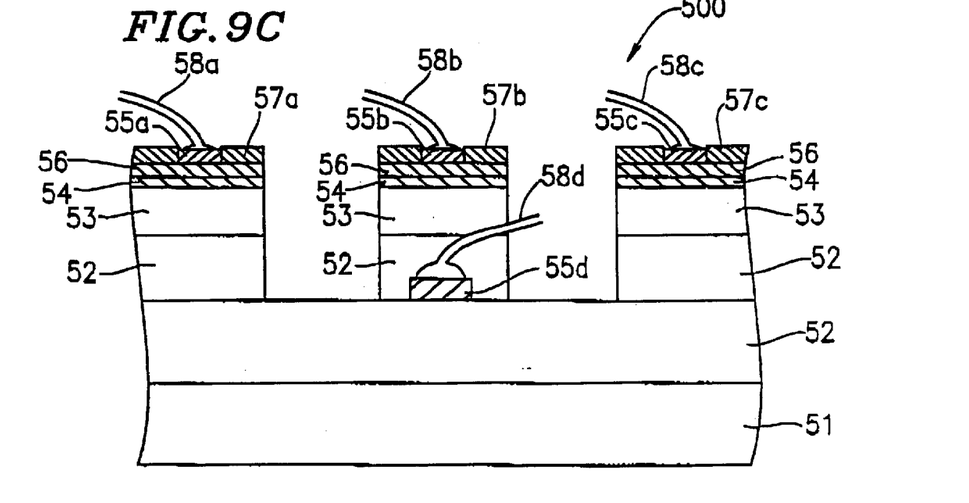

FIGS. 9A to 9C illustrate a method for manufacturing the gallium nitride group compound semiconductor light-emitting device 500 according to the fifth example of the present invention.

As illustrated by a laminated structure 501 in FIG. 9A, an N-type gallium nitride group compound semiconductor layer 52' and a P-type gallium nitride group compound semiconductor layer 53' are laminated in this order on a sapphire substrate 51', thereby forming a laminated structure of semiconductor layers including the light-emitting region. As a light-transmittable ohmic metal thin film 54, a layer of Ni with a thickness of about 10 nm is then formed on the P-type gallium nitride group compound semiconductor layer 53'. As a light-transmittable oxide semiconductor layer 56, a layer of $In_2O_3$ including Sn as a dopant and having a thickness of about 0.5 μm is then formed on the metal thin film 54.

Layers of Au with a thickness of about 0.5 μm are formed thereon as pad electrodes 55a, 55b, and 55c for providing an external electric connection. Although in this example the pad electrodes 55a, 55b, and 55c are formed on the oxide semiconductor layer 56, they may be alternatively formed on the metal thin film 54. On the oxide semiconductor layer 56, a blue light-emitting fluorescent material layer 57a formed of ZnS:Ag, a green light-emitting fluorescent material layer 57b formed of ZnS:Cu, and a red light-emitting fluorescent material layer 57c formed of $Y_2O_3$:Eu are provided. As in the first example, a spin coat method is used for forming the fluorescent material layers 57a, 57b, and 57c, and therefore explanation thereof is omitted. Other than spin coating, the method for forming the fluorescent material layers 57a, 57b, and 57c includes a variety of forming methods, such as evaporation methods, patterning of the materials dispersed in an organic solvent or a resin by screen printing, casting, molding, or the like. In the next step, the light-emitting region is formed. A resist 59 in applied to a predetermined surface of the laminated structure 501. Using a conventional photoetching process, unnecessary portions of the oxide semiconductor layer 56 are removed by a ferric chloride group solution. Unnecessary portions of the metal thin film 54 are then removed using an etching process.

As indicated by reference numeral 50 in FIG. 9B, a laminated structure 502 is dry etched using the resist 59 as a dry etching mask, until portions of the surface of the N-type gallium nitride group compound semiconductor layer 52' are exposed.

An N-type pad electrode 55d is then formed on the exposed surface of the N-type gallium nitride group compound semiconductor layer 52' (see FIG. 9C) by laminating layers of Al (film thickness: about 1500 Å) and Ti (film thickness: about 200 Å). After forming the N-type pad electrode 55d, the sapphire substrate 51' shown in FIG. 9B is cut by dicing, scribing, or the like, whereby the laminated structure 502 of the light-emitting device is divided into a chip of an about 800 μm square. Finally, Au wires 58a, 58b, 58c, and 58d are formed on the pad electrodes 55a, 55b, 55c, and 55d, respectively, so as to provide the pad electrodes 55a, 55b, 55c, and 55d within external electrical connection. Accordingly, the gallium nitride group compound semiconductor device 500 shown in FIG. 6C is completed.

Although in the present example of the invention, the N-type pad electrode 55d is provided as a common electrode, a plurality of N-type pad electrodes may alternatively be provided corresponding to the respective light-emitting regions.

As described above, by inserting the light oxide semiconductor layer 56 between the metal thin film 54 and the fluorescent material layers 57a, 57b, and 57c, a better ohmic characteristic between the metal thin film 54 and the P-type gallium nitride group compound semiconductor layer 53, and a uniform current dispersion are obtained.

Therefore, the present invention overcomes the conventional problems associated with electrical characteristic between the P-type gallium nitride group compound semiconductor layer 53 and the metal thin film 54, and thus provides a gallium nitride group compound semiconductor device 500 (e.g., having blue light emittance with a light-emitting peak wavelength of 450 nm, green light emittance with a light-emitting peak wavelength of 530 nm, and red light emittance with a light-emitting peak wavelength of 611 nm) which has a uniform emittance and a good light-emitting efficiency, and is suitable for mass-production.

Accordingly, by inserting the oxide semiconductor layer 56 between the metal thin film 54 and the fluorescent material layers 57a, 57b, and 57c, the present example of the invention provides a gallium nitride group compound semiconductor device 500, which has a good ohmic contact between the metal thin film 54 and the gallium nitride group compound semiconductor layer 53, which is capable of emitting light in a variety of wavelengths, overcoming the problem associated with electric characteristics, and which is suitable for mass-production.

According to the present invention, a gallium nitride group compound semiconductor light-emitting device capable of emitting a variety of light wavelengths includes the light-transmittable oxide semiconductor layer inserted between a light-transmittable ohmic metal thin film layer formed on semiconductor layers and a fluorescent layer(s) for converting the wavelength of at least a portion of the light emitted from a light emitting region into a different wavelength. This makes it possible to prevent an irregular current flow due to a crack being created in the metal thin film during the formation of the fluorescent layer(s). Furthermore, by forming the heat-stable oxide semiconductor layer on the metal thin film, deterioration of the device during the formation of the fluorescent layer(s) is prevented. Accordingly, the oxide semiconductor layer is capable of acting as a conductive film as well as a protection layer for the metal thin film, thereby achieving a reliable gallium nitride group compound semiconductor light-emitting device which can provide a uniform current flow.

In addition, by forming the oxide semiconductor layer which reinforces the conductivity of the metal thin film and acts as a protection layer, and providing the fluorescent material layer thereon, a gallium nitride group compound semiconductor light-emitting device is provided which is suitable for mass-production and effectively emits light to the outside of the device.

According to the structure described above, the oxide semiconductor layer formed on the metal thin film is designed to have a suitable thickness, thereby making it possible to provide an oxide semiconductor layer which is excellent in conductivity and durability, and transmits a large portion of light from the light-emitting region. As a result, a highly-efficient and highly reliable device is provided, in which a uniform light-emitting pattern is obtained in the light-emitting region.

Furthermore, by directly providing an external connection to the oxide semiconductor layer, the manufacturing time and the device cost can be reduced.

Moreover, by providing a plurality of fluorescent material layers each of which has a different light-emitting peak wavelength to one another, it is possible to easily produce a light-emitting device capable of emitting light having a plurality of light-emitting wavelengths (for example, the three primary colors of light, l.e., red, green and blue), with substantially the same size as a conventional device. In addition, it is possible to produce devices having different wavelengths on another at the same time. Therefore, the normalization of the device characteristics is facilitated.

As described above, according to the present inventions a gallium nitride group compound semiconductor light-emitting device is provided which achieves a uniform light-emitting pattern, has an improved reliability, and has a variety of light-emitting wavelengths, e.g., blue light, green light, red light, white light, and the like.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A semiconductor light-emitting device comprising:
   a substrate;
   a semiconductor layer including at least a light-emitting region;
   a metal layer having a light transmitting characteristic on the semiconductor layer;
   a fluorescent material layer for converting at least a portion of first light emitted from the light-emitting region into second light having a different wavelength from the first light; and
   an oxide semiconductor layer formed between and directly contacting the metal layer and the fluorescent material layer, and having a light-transmitting characteristic,
   wherein the first light transmitting into the fluorescent material layer to convert the wavelength is light transmitted through the metal layer, wherein:
      a bottom surface area of the metal layer is smaller than a bottom surface area of the oxide semiconductor layer; and
      the fluorescent material layer covers a side face of the oxide semiconductor layer and a side face of the semiconductor layer.

2. A semiconductor light-emitting device according to claim 1, wherein the semiconductor layer is formed of a gallium nitride group compound semiconductor.

3. A semiconductor light-emitting device according to claim 1, wherein the metal layer is formed of an ohmic metal thin film.

4. A semiconductor light-emitting device according to claim 1, wherein a thickness of the metal layer is from about 1 nm to about 10 nm.

5. A semiconductor light-emitting device according to claim 1, wherein a thickness of the oxide semiconductor layer is from about 0.1 $\mu$m to about 1 $\mu$m.

6. A semiconductor light-emitting device according to claim 1, wherein the oxide semiconductor layer includes at least one substance selected from the group consisting of $In_2O_3$, $SnO_2$, $ZnO$, $Cd_2SnO_4$, and $CdSnO_3$.

7. A semiconductor light-emitting device according to claim 1, wherein a first electrode is formed on a portion of the metal layer.

8. A semiconductor light-emitting device according to claim 1, wherein a second electrode is formed on a portion of the oxide semiconductor layer.

9. A semiconductor light-emitting device according to claim 1, wherein a conductive wire is formed on a portion of the oxide semiconductor layer.

10. A semiconductor light-emitting device according to claim 1, wherein the fluorescent material layer further covers a side face of the substrate.

11. A semiconductor light-emitting device according to claim 1, wherein the fluorescent material layer is obtained by laminating a plurality of fluorescent material layers, each of the plurality of fluorescent material layers having a different light-emitting wavelength from one another.

12. A semiconductor light-emitting device according to claim 1, wherein the oxide semiconductor layer enables a uniform current dispersion over the metal layer.

13. A semiconductor light-emitting device comprising:
   a substrate;
   a semiconductor layer including at least a light-emitting region on the substrate;
   a metal layer having a light transmitting characteristic on the semiconductor layer;
   an oxide semiconductor layer formed directly on the metal layers and
   a fluorescent material layer on the oxide semiconductor layer so as to cover the top and side faces thereof, the fluorescent material layer for converting at least a portion of first light emitted from the light-emitting region into second light having a different wavelength from the first light;

wherein the oxide semiconductor layer is positioned between the fluorescent material layer and the metal layer, and has a light-transmitting characteristic, and wherein a bottom surface area of the metal layer is smaller than a bottom surface area of the oxide semiconductor layer.

14. A semiconductor light-emitting device according to claim 13, wherein the fluorescent material layer further covers the side faces of the semiconductor layer.

15. A semiconductor light-emitting device according to claim 13, wherein the semiconductor layer is formed of a gallium nitride group compound semiconductor.

16. A semiconductor light-emitting device according to claim 13, wherein the metal layer is formed of an ohmic metal thin film.

17. A semiconductor light-emitting device according to claim 13, wherein a thickness of the metal layer is from about 1 nm to 10 nm.

18. A semiconductor light-emitting device according to claim 13, wherein a thickness of the oxide semiconductor layer is from about 0.1 $\mu$m to about 1 $\mu$m.

19. A semiconductor light-emitting device according to claim 13, wherein the oxide semiconductor layer includes at least one substance selected from the group consisting of $In_2O_3$, $SnO_2$, $ZnO$, $Cd_2SnO_4$, and $CdSnO_3$.

20. A semiconductor light-emitting device according to claim 13, wherein a first electrode is formed on a portion of the metal layer.

21. A semiconductor light-emitting device according to claim 13, wherein a second electrode is formed on a portion of the oxide semiconductor layer.

22. A semiconductor light-emitting device according to claim 13, wherein a conductive wire is formed on a portion of the oxide semiconductor layer.

23. A semiconductor light-emitting device according to claim 13, wherein the fluorescent material layer is obtained by laminating a plurality of fluorescent material layers, each of the plurality of fluorescent material layers having a different emitting wavelength from one another.

* * * * *